United States Patent
Asano et al.

(10) Patent No.: US 7,206,552 B2
(45) Date of Patent: *Apr. 17, 2007

(54) SEMICONDUCTOR SWITCHING DEVICE

(75) Inventors: Tetsuro Asano, Oizumi-machi (JP);
Toshikazu Hirai, Oizumi-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 661 days.

This patent is subject to a terminal disclaimer.

(21) Appl. No.: 10/105,802

(22) Filed: Mar. 26, 2002

(65) Prior Publication Data

US 2002/0145169 A1    Oct. 10, 2002

(30) Foreign Application Priority Data

Mar. 27, 2001    (JP) .............................. 2001-089343

(51) Int. Cl.
*H04B 1/44*    (2006.01)
*H01L 29/06*    (2006.01)
*H01L 31/00*    (2006.01)

(52) U.S. Cl. .......................... 455/78; 455/83; 257/20; 257/24; 257/27; 257/192; 257/210

(58) Field of Classification Search .................. 455/78, 455/326, 327, 84, 83; 257/20, 24, 27, 192, 257/210, 280, 281, 282, 133, 138

See application file for complete search history.

(56) References Cited

U.S. PATENT DOCUMENTS

| | | | | |
|---|---|---|---|---|
| 3,974,486 A | * | 8/1976 | Curtis et al. | 365/72 |
| 4,224,088 A | * | 9/1980 | Komatsu et al. | 438/340 |
| 4,420,743 A | * | 12/1983 | Upadhyayula | 341/136 |
| 5,081,706 A | * | 1/1992 | Kim | 455/78 |
| 5,945,867 A | * | 8/1999 | Uda et al. | 327/431 |
| 6,107,866 A | * | 8/2000 | Migliavacca | 327/539 |
| 6,580,107 B2 | * | 6/2003 | Asano et al. | 257/282 |

FOREIGN PATENT DOCUMENTS

| | | |
|---|---|---|
| EP | 0625831 A2 | 11/1994 |
| EP | 0784345 A2 | 7/1997 |
| JP | 63-20041 | 4/1988 |
| JP | 6-29811 | 2/1994 |
| JP | 6-334506 | 12/1994 |
| JP | 7-303001 | 11/1995 |
| JP | 8-70245 | 3/1996 |
| JP | 8-195667 | 7/1996 |
| JP | 8-204528 | 8/1996 |
| JP | 8-204530 | 8/1996 |
| JP | 8-213891 | 8/1996 |
| JP | 2557561 | 9/1996 |
| JP | 8-293776 | 11/1996 |
| JP | 9-8501 | 1/1997 |
| JP | 9-55682 | 2/1997 |
| WO | WO-00/74144 A1 | 12/2000 |

OTHER PUBLICATIONS

Ohbata et al., "High Power Handling GaAs SWIC for GSM Application" NEC Tech. Review 52(3), 1999. pp. 150-152.

(Continued)

*Primary Examiner*—Matthew Anderson
*Assistant Examiner*—Eugene Yun
(74) *Attorney, Agent, or Firm*—Morrison & Foerster LLP (57) ABSTRACT

A semiconductor switching device includes two FETs with different device characteristics, a common input terminal, and two output terminals. The gate width of each FET is about 400 μm, and the maximum power required for the device operation is maintained by a lager conductivity of the channel layer of one FET and by a lower conductivity of the channel layer of another FET. The device operates at frequencies of 2.4 GHz or higher without use of shunt FET.

9 Claims, 8 Drawing Sheets

OTHER PUBLICATIONS

Kohama et al., "High Power DPDT Antenna Switch MMIC for Digital Cellular Systems" IEEE Journal of Solid-State Circuits, 31(10), 1996, pp. 1406-1411.

Nogawa et al., "Compact GaAs ICs for PHS" Sanyo Technical Review, 29(1), 1997, pp. 52-59.

M. J. Schindler et al. (1990) "A High Power 2-18Ghz T/R Switch," IEEE 1990 Microwave and Millimeter-Wave Monolithic Circuits Symposium, pp. 119-122.

European Search Report dated Mar. 29, 2005, directed to counterpart application.

* cited by examiner

FIG.1A

PRIOR ART

FIG.1B

PRIOR ART

Pinch-off voltage = 1.5V

| Gate Width(μm) | Idss(A) | Maximum Power(dBm) |
|---|---|---|
| 100 | 0.015 | 5.22 |
| 200 | 0.03 | 11.24 |
| 300 | 0.05 | 14.76 |
| 400 | 0.06 | 17.26 |
| 600 | 0.09 | 20.79 |
| 800 | 0.12 | 23.28 |
| 1000 | 0.15 | 25.22 |

FIG.5B

Pinch-off voltage = 2.2V

| Gate Width(μm) | Idss(A) | Maximum Power(dBm) |
|---|---|---|
| 100 | 0.023 | 8.94 |
| 200 | 0.05 | 14.96 |
| 300 | 0.07 | 18.48 |
| 400 | 0.09 | 20.98 |
| 600 | 0.14 | 24.50 |
| 800 | 0.18 | 27.00 |
| 1000 | 0.23 | 28.94 |

SEMICONDUCTOR SWITCHING DEVICE

BACKGROUND OF THE INVENTION

1. Field of the Invention

The invention relates to a semiconductor switching device for switching at high frequencies, especially to a compound semiconductor switching device operating at frequencies equal to or higher than 2.4 GHz.

2. Description of the Related Art

Mobile communication devices such as mobile telephones often utilize microwaves in the GHz range, and commonly need switching devices for high frequency signals which are used in switching circuits for changing antennas and switching circuits for transmitting and receiving such signals. A typical example of such a switching device can be found in Japanese Laid-Open Patent Application No. Hei 9-181642. Such a device often uses a field-effect transistor (called FET hereinafter) formed on a gallium arsenide (GaAs) substrate, as this material is suitable for use at high frequencies, and developments have been made in forming a monolithic microwave integrated circuit (MMIC) by integrating the aforementioned switching circuits.

Figure 1A:
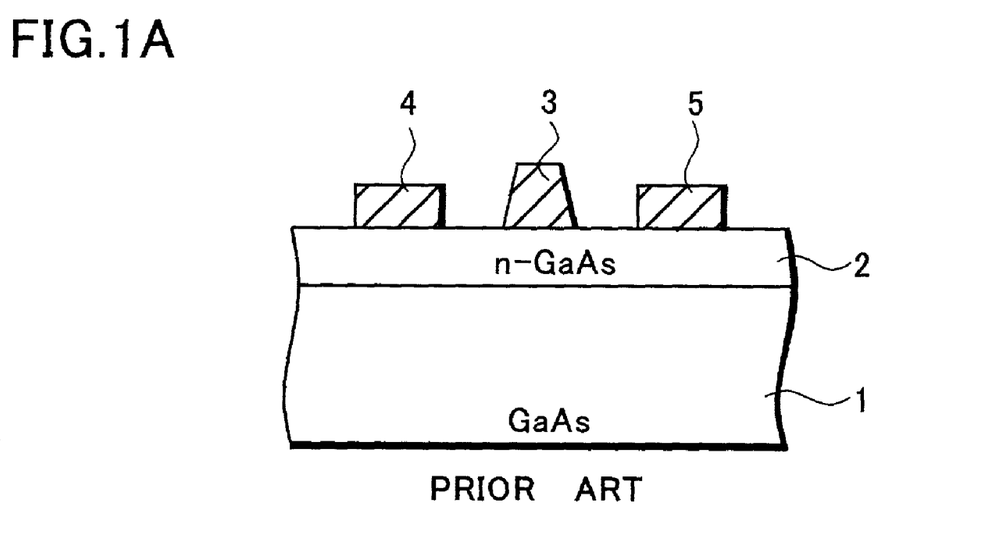
FIG. 1A is a cross-sectional view of a conventional switching device.

FIG. 1A is a cross-sectional view of a conventional GaAs metal-semiconductor field-effect transistor (MESFET). The GaAs substrate 1 is initially without doping, and has beneath its surface a n-type channel region (or a channel layer) 2 formed by doping with n-type dopants. A gate electrode 3 is placed on the surface of the channel region 2, forming a Schottky contact, and a source electrode 4 and a drain electrode 5 are placed on both sides of the gate electrode 3, forming ohmic contacts to the surface of the channel region 2. In this transistor configuration, a voltage applied to the gate electrode 3 creates a depletion layer within the channel region 2 beneath the gate electrode 3 and thus controls the channel current between the source electrode 4 and the drain electrode 5.

Figure 1B:
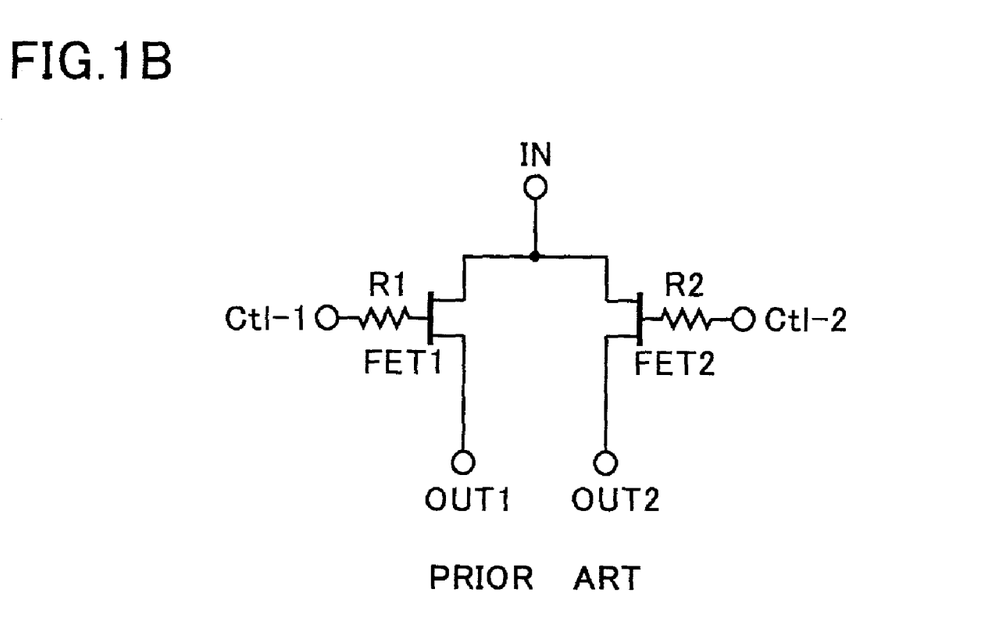
FIG. 1B is a circuit diagram of a conventional SPDT switch.

FIG. 1B shows the basic circuit configuration of a conventional compound semiconductor switching device called a SPDT (Single Pole Double Throw) switch, using GaAs FETs. The source electrode (or the drain electrode) of each FET (FET1 and FET2) is connected to a common input terminal IN. The drain electrode (or source electrode) of each FET (FET1 and FET2) is connected to respective output terminals (OUT1 and OUT2). The gates of FET1 and FET2 are connected to the control terminals Ctl-1, Ctl-2 through resistors R1, R2, respectively. A pair of complementary signals is applied to the two control terminals, Ctl-1, Ctl-2. When a high level signal is applied to the control terminal of one of the FETs, the FET changes to an on-state, and a signal fed to the common input terminal IN passes through the FET and reaches one of the output terminals OUT1, OUT2. The role of the resistors R1 and R2 is to prevent the leaking of the high frequency signals through the gate electrodes to the DC voltages applied to the control terminals Ctl-1, Ctl-2, which are substantially grounded at high frequency.

The circuit shown in FIG. 1B is symmetrical because the two FETs have substantially identical high frequency characteristics and substantially identical FET characteristics including required maximum power and pinch-off voltage. This type of switching circuit has two identical signal paths (FETs), which can serve as both signal transmitting paths and signal receiving paths. This type of circuit will be called a symmetrical circuit hereinafter.

The switching device shown in FIG. 1B must have shunts, which lead leaking signals to the ground, in order to attain a high degree of isolation. Alternatively, the gate width may be reduced to about 600 μm without utilizing shunts so that overall size of the switching device is reduced with a proper isolation, as described in commonly owned copending U.S. patent application Ser. No. 09/855,030, entitled "COMPOUND SEMICONDUCTOR DEVICE FOR SWITCHING." The disclosure of U.S. patent application Ser. No. 09/855,030 is in its entirety incorporated herein by reference.

However, further reduction of the gate width results in a reduction of the maximum power allowed to pass through the switching device. For example, the maximum power allowed for transmitting signals is less than 20 dBm when the gate width is reduced to 400 μm or smaller. This maximum power is not enough to transmit signals when the switching device is used in a system conforming to the BLUETOOTH or Wireless LAN standard.

SUMMARY OF THE INVENTION

This invention provides a semiconductor switching device including a first field effect transistor and a second field effect transistor, each of which includes a source electrode, a gate electrode and a drain electrode which are formed on a channel layer of the respective transistor. Each of the first transistor and the second transistor has a gate width equal to or less than 400 μm, and the first transistor and the second transistors have different saturation currents. The semiconductor switching device of the invention also includes a common input terminal connected to the source electrode or the drain electrode of the first transistor and connected to the source electrode or the drain electrode of the second transistor, a first output terminal connected to the source electrode or the drain electrode of the first transistor which is not connected to the common input terminal, and a second output terminal connected to the source electrode or the drain electrode of the second transistor which is not connected to the common input terminal. The gates of the first transistor and the second transistor receive control signals so that one of the transistors opens as a switching element and the other of the transistors closes as another switching element.

The transistor with the higher saturation current may have a higher pinch-off voltage than the transistor with the lower saturation current. The difference between the reverse bias voltage applied to the transistor with the lower saturation current and the pinch-off voltage of the same transistor may be such that the transistor with the lower saturation current withstands a predetermined maximum power level when the transistor with the higher saturation current allows the predetermined power to pass therethrough. The channel layers of the first transistor and the second transistor may have different impurity concentrations or different depths. The switching device may further include a semi-insulating GaAs substrate on which the channel layers are formed. The gate electrodes of the first transistor and the second transistor may form Schottky contacts with the channel layer and the source and drain electrodes of the first transistor and the second transistor may form ohmic contacts with the channel layer.

DETAILED DESCRIPTION OF THE INVENTION

An embodiment of this invention will be described hereinafter with reference to the FIGS. 2–9.

Figure 2:
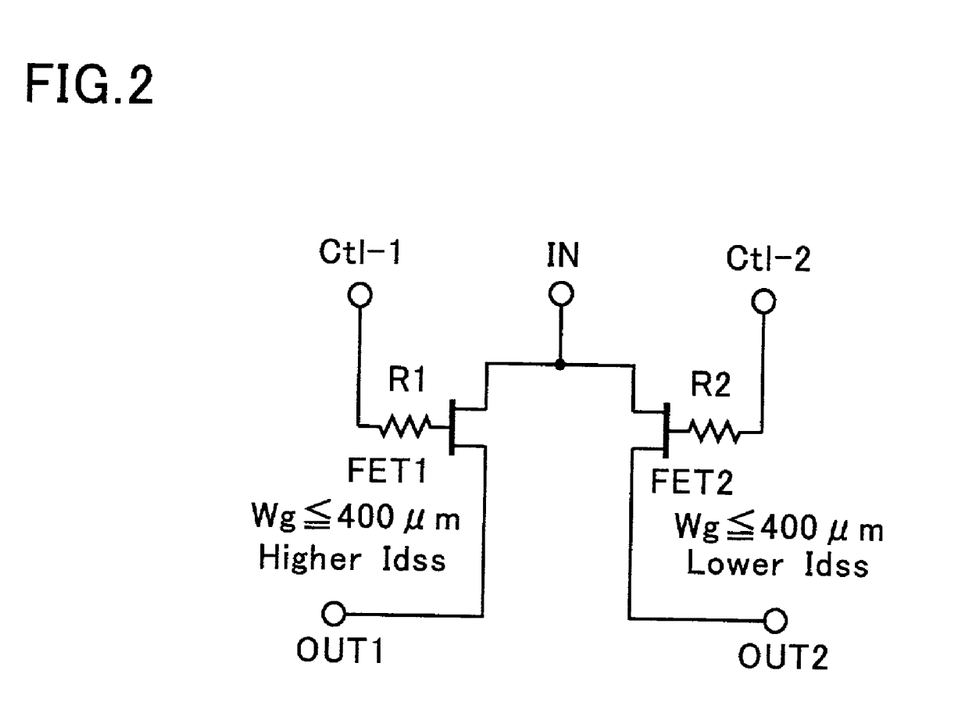
FIG. 2 is a circuit diagram of a semiconductor switching circuit device of an embodiment of this invention.

FIG. 2 is a circuit diagram of a semiconductor switching circuit device of an embodiment of this invention, which preferably operates at a frequency of 2.4 GHz or higher. The device has first and second FETs (FET1, FET2), each of which has a source electrode, a gate electrode and a drain electrode on its channel layer. The device also has a common input terminal IN connected to the source electrodes (or the drain electrodes) of the FETs (FET1, FET2), a first output terminal connected to the drain electrode (or the source electrode) of the first FET (FET1), and a second output terminal connected to the drain electrode (or the source electrode) of the second FET (FET2). The gate electrode of FET1 is connected to a control terminal Ctl-1 via resistor R1, and the gate electrode of FET2 is connected to a control terminal Ctl-2 via resistor R2. A pair of complementary signals is applied to the control terminals Ctl-1, Ctl-2 so that one of FET1 and FET2, which receives a H-level signal, turns on and connects the common input terminal and the output terminal connected to the FET, and the other of FET1 and FET2, which receives a L-level signal, remains turned off. In other words, the FET receiving the H-level signal opens as a switching element and the FET receiving the L-level signal closes as another switching element. The resistors R1, R2 prevent leaking of high frequency signals from the gate electrodes to the control terminals Ctl-1, Ctl-2.

Figure 3:
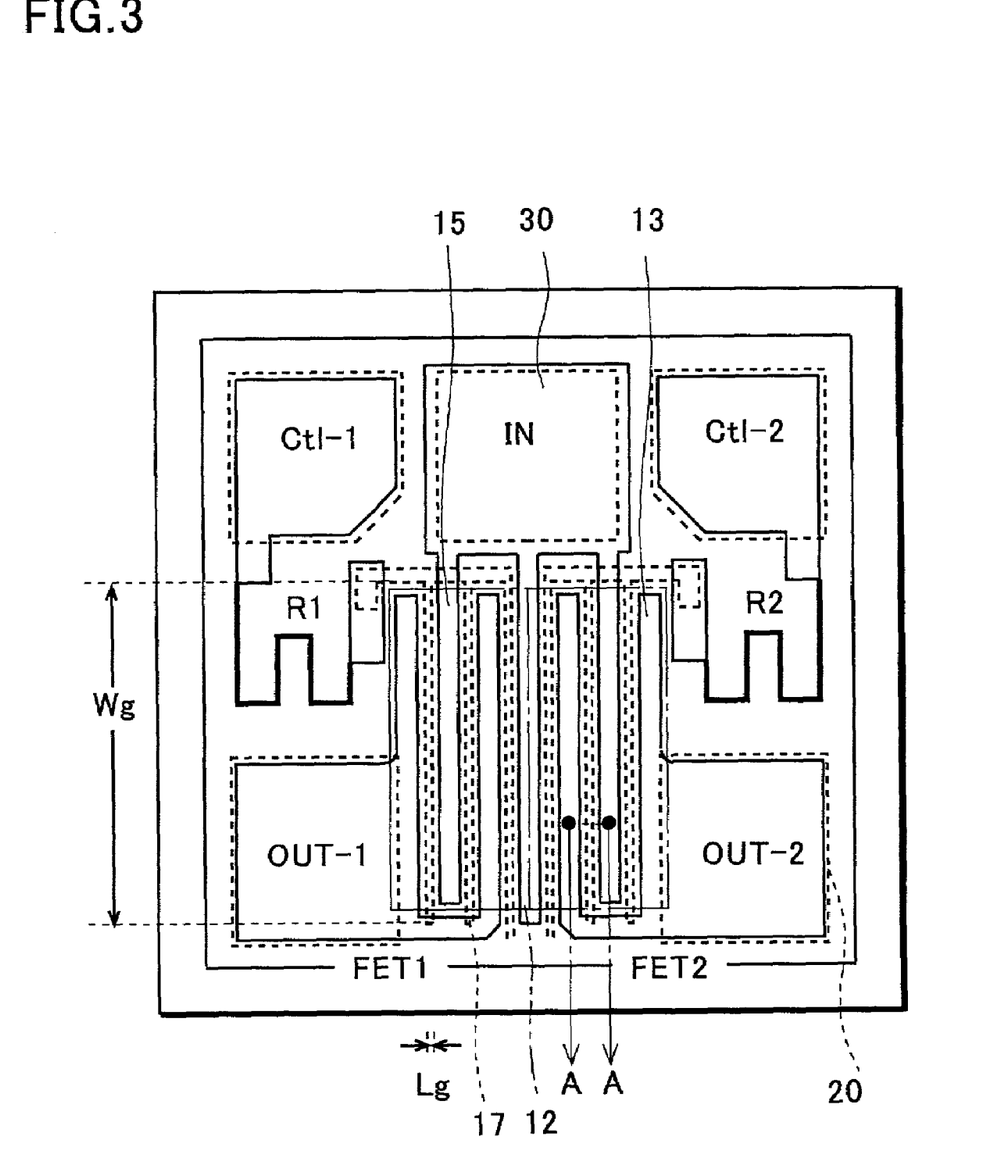
FIG. 3 is a plan view of a switching device of the embodiment of FIG. 2 integrated as a chip.
Figure 4:
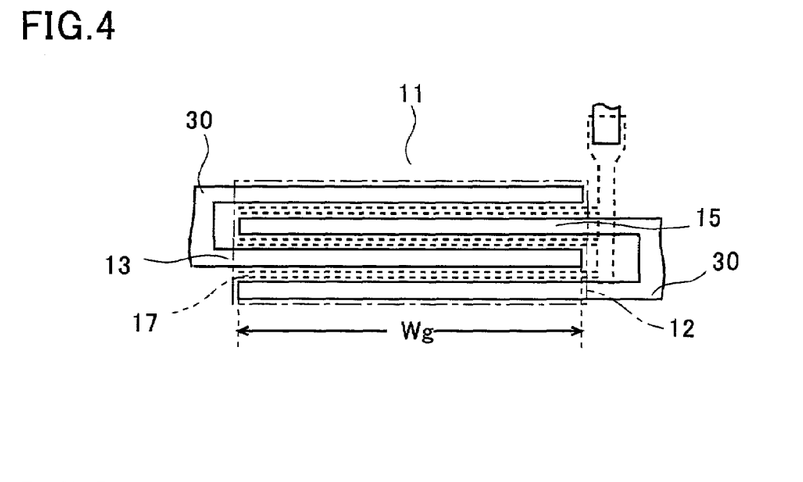
FIG. 4 is an expanded plan view of the gate portion of the switching FET shown in FIG. 3.

One of the characteristics of the switching device of FIG. 2 is that the gate width Wg, which is the summation of the width of each gate in the FET structure as described later with reference to FIG. 4, is equal to or less than 400 μm for both FET1 and FET2. However, simply reducing the gate width Wg results in an increase in on-state resistance of the FET. The gate width reduction also results in a reduction of the parasitic capacitance, which is generated by the Schottky contact between the gate electrode and the channel layer, because of the reduced surface area of the gate electrode (Wg×Lg in FIG. 3). These changes may lead to a significant changes in circuit operation characteristics.

Another characteristic of the switching device of FIG. 2 is that FET1 and FET2 have different saturation currents (the saturation current will be called as Idss hereinafter) or different pinch-off voltages. In other words, the switching device of FIG. 2 is an asymmetrical circuit. Idss is the electric current between a drain and a source of an FET when the current between the drain and the source becomes saturated under the application of a high enough voltage between the drain and the source while keeping the source and the gate at an equal voltage.

The maximum power allowed for a switching device is determined by the Idss of the FET used for transmitting signals and the pinch-off voltage of the FET used for receiving signals.

The Idss of the FET, which turns on while transmitting signals, determines the maximum power ($P_{out1}$) in dBm as follows:

$$P_{out1} = 10 \log_{10}\{[(2R \times Idss/1.3)^2 \times 1/(8R)] \times 1000\} \quad (1)$$

in which R is load resistance, which is 50Ω in this embodiment.

On the on side, the maximum power allowed for a switching device decreases when the gate width Wg decreases from 600 μm to 400 μm because the Idss decreases accordingly, as predicted by equation 1. The term "on side" refers to an FET which turns on during a particular type of operation. In this particular instance, the on side FET is the FET which turns on while transmitting signals. Similarly, an FET, which turns off during a particular operation, is on the off side. However, this reduction of Idss due to the reduction of the gate width Wg can be compensated for by preventing the reduction of Idss by modifying other design features of the FET. This may be accomplished by increasing the depth of the channel region, or by increasing the impurity concentration of the channel layer.

On the off side, the FET used for receiving signals, which is turned off during signal transmission by the other FET, has to withstand the voltage required for generating the allowed maximum power of the FET used for transmitting signals while the FET is transmitting signals. This can be accomplished by lowering the pinch-off voltage of the FET on the off side, as will be later described in detail. In general, the pinch-off voltage of FET can be lowered by reducing the depth of the channel layer or the impurity concentration of the channel layer.

Accordingly, the FET on the on side which has a larger channel layer depth or a higher channel layer impurity concentration serves substantially as a signal transmitting path, and the FET on the off side which has a smaller channel layer depth or a lower channel layer impurity concentration serves substantially as a signal receiving path. Thus, this circuit is asymmetrical. As long as each FET conforms to its designated role, either signal transmitting or signal receiving, this asymmetrical switching device operates efficiently.

FIG. 3 is an example of a semiconductor switching device integrated as a compound semiconductor chip, based on the circuit design of FIG. 2. The two switching FETs (FET1 on the left, FET2 on the right) occupy the central portion of a GaAs substrate. Resistors R1, R2 are connected to the gates of the two respective FETs. The terminals, IN, OUT1, OUT2, Ctl-1, Ctl-2 occupy a significant area of the substrate surface as connecting pads. The dashed lines indicate a second layer of wiring which is formed in the same processing step as the gate electrodes of the FET and is made of a gate metal layer (Ti/Pt/Au) 20. A third layer of wiring indicated by the solid lines is for connecting the device elements and forming the connecting pads, and is made of a pad metal layer (Ti/Pt/Au) 30. A first layer contains an ohmic metal layer (AuGe/Ni/Au) 10 making an ohmic contact with the substrate, which forms the source electrode, the drain electrode and electrodes for the resistors. In FIG. 3, the first layer is not shown, as it overlaps with the pad metal layer. To reduce overall device size, the drain electrode 15 in the middle of the three drain electrode extending from the common input terminal IN is shared by FET1 and FET2. The switching device of this embodiment does not have shunts because isolation is assured by making the gate width Wg small. The switching device of FIG. 3 has a gate width Wg of about 400 μm and a gate length Lg of about 0.5 μm. The chip size of this switching device is about 0.31× 0.31 mm².

FIG. 4 shows an expanded plan view of FET1 showing a comb-like structure including the source electrode 13, the drain electrode 15, and the gate electrode 17. The rectangle area 12 denoted by the unevenly broken line shows the channel layer formed on a GaAs substrate 11. The source electrode 13 (or the drain electrode) is formed of the pad metal layer (Ti/Pt/Au) 30 as the third layer extending from the left side of the drawing, has a comb-like structure having two teeth, and is connected to the output terminal OUT1. The source electrode 14 (or the drain electrode) which is formed of the ohmic metal layer (AuGe/Ni/Au) 10 as the first layer is formed underneath the source electrode 13. The drain electrode 15 (or the source electrode) is formed of the pad metal layer (Ti/Pt/Au) 30 as the third layer extending from the right side of the drawing, has a comb-like structure having two teeth, and is connected to the common input terminal IN. The drain electrode 16 (or the source electrode) which is formed of the ohmic metal layer (AuGe/Ni/Au) 10 as the first layer is formed underneath the drain electrode 15. The source electrode 13 and the drain electrode 15 are juxtaposed in a interleaved relationship to each other, and three gate electrodes 17, which are formed of the gate metal layer 20 as the second metal layer, are formed between the teeth of the combs on the channel region 12, creating another comb-like structure.

The gate width Wg is defined as the summation of the lengths of the gate electrode 17 within the channel layer 12. In the construction of FIG. 4, the total length of the three teeth of the gate electrode comb-like structure 17 constitutes the gate width Wg.

The pinch-off voltage, which is the voltage required to turn an FET off, varies depending on the impurity concentration and the depth of the channel layer 12 of the FET, which is formed by ion implantation. The pinch-off voltage is high when the total dose of the impurity ion implanted into the channel layer 12 is high (high concentration) or the acceleration voltage for ion implantation is high (large depth). On the contrary, the pinch-off voltage is low when the total dose of the impurity ion implanted into the channel layer 12 is low (low concentration) or the acceleration voltage for ion implantation is low (small depth).

In the meantime, the Idss increases with the increase of the total dose or the acceleration voltage of the impurity ions, and decreases with the decrease of total dose or the acceleration voltage of the impurity ions. In general, a channel layer which has a high pinch-off voltage also has a large Idss. If such an FET is used as a signal transmitting FET (or on-side FET), the allowed maximum power is high.

On the other hand, a channel layer which has a low pinch-off voltage also has a small Idss. If such an FET is used as a signal receiving FET (or off-side FET), the FET can withstand a high voltage applied to the signal receiving FET when the signal transmitting FET is transmitting signals with the maximum power.

Figure 5A:
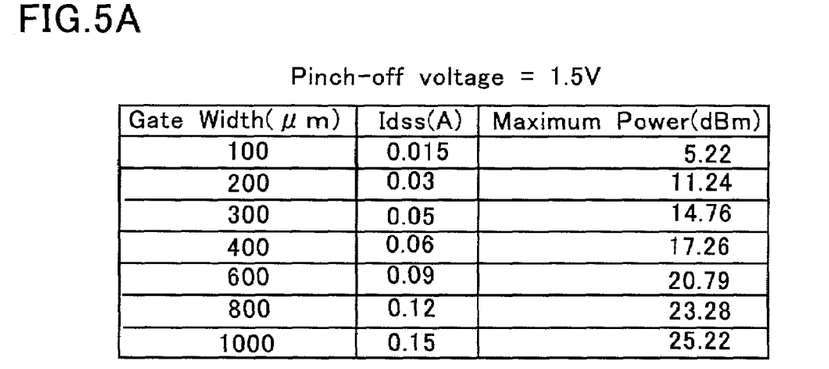
FIG. 5A shows the allowed maximum power for a symmetrical switching device as a function of gate width and Idss.
Figure 5B:
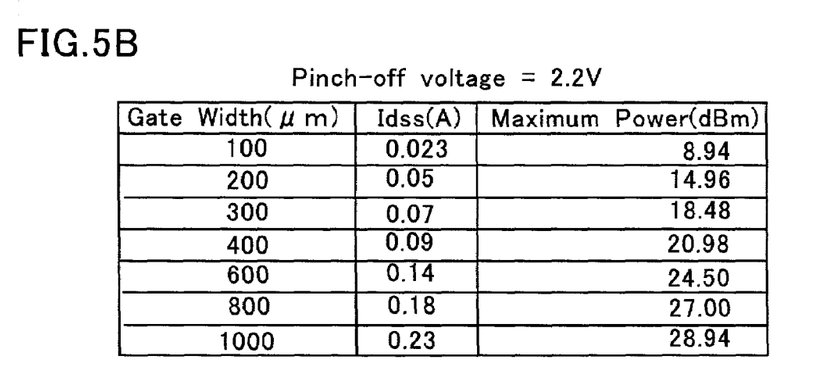
FIG. 5B shows the allowed maximum power for an asymmetrical switching device as a function of gate width and Idss.

The allowed maximum power (Pout) is the lower of the power determined by the Idss of an FET which is in an on-state and the power determined by the pinch off voltage of an FET which is in an off-state. The data shown in FIGS. 5A and 5B show only the power of the FET which is in an on-state as a function of gate width and Idss of the FET. FIG. 5A is for designing the FET in a symmetrical switch, and shows that a minimum gate width of 600 μm is required for providing a maximum power of 20 dBm, which is required for applications including BLUETOOTH and Wireless LAN, when the pinch-off voltage is 1.5 V. On the other hand, FIG. 5B is for designing the signal transmitting FET in an asymmetrical switch, and shows that a gate width of 400 μm is enough to provide the maximum power of 20 dBm when the pinch-off voltage is 2.2 V. The impurity concentration of the channel is higher in the FET of FIG. 5B than in the FET of FIG. 5A. As a result, the gate width of the FET of FIG. 5B is two-thirds of the gate width of the FET of FIG. 5A.

Figure 6A:
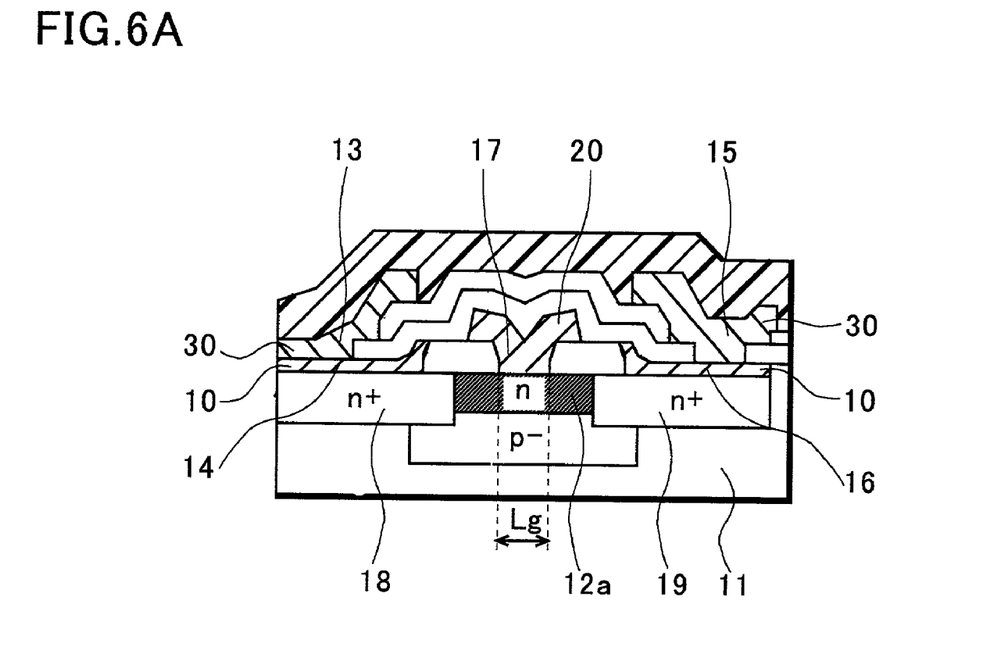
FIG. 6A is a cross-sectional view of FET1 in the embodiment of FIG. 3 showing the impurity concentration of the channel layer.
Figure 6B:
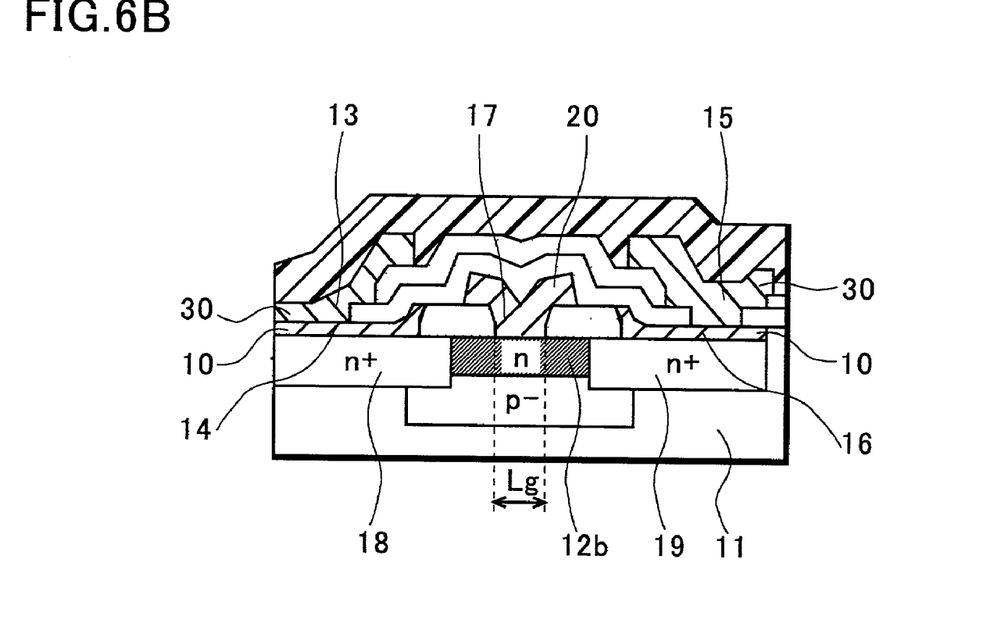
FIG. 6B is a cross-sectional view of FET2 in the embodiment of FIG. 3 showing the impurity concentration of the channel layer.

FIGS. 6A and 6B show cross-sectional views of FET1 and FET2 of this embodiment. The line on which the cross section of FIG. 6B is drawn is shown in FIG. 3 as line A—A in FET2. A corresponding portion of FET1 is also cut for the cross-sectional view. The allowed maximum power is determined by the Idss of the signal transmitting FET and the pinch-off voltage of the signal receiving FET when the signal transmitting FET is transmitting signals. In this embodiment, FET1, the signal transmitting FET, has a channel layer with a high impurity concentration to provide a high Idss, and FET2, the signal receiving FET, has a channel layer with a low impurity concentration to provide a low pinch-off voltage. Such a device construction is achieved by forming the two channel layers of the FET1 and FET2 with different total dosages (a higher dosage for FET1 and a lower dosage for FET2) but with the same ion acceleration voltage (a roughly equal depth).

FIG. 6A is a cross-sectional view of FET1. FET1 has a n-type channel region 12a with a high Idss formed on a GaAs substrate 11. FET1 also has the source region 18 and the drain region 19, both of which are of a n+-type high impurity region and formed at respective ends of the channel region 12a.

The channel region 12a of FET1 (on side) has a high Idss because of a high impurity concentration in the region. Impurity ions ($^{29}Si^+$) are implanted into the area of the GaAs substrate for the channel layer formation with a total dose of $4.6 \times 10^{12}$ cm$^{-3}$ under an acceleration voltage of 70 KeV. The formed channel region 12a is not etched when the gate electrodes are formed. FET1 formed under above conditions exhibits an Idss of 0.09 ampere when the gate width was 400 μm, as already described with reference to FIG. 5B. This FET1 has also shown a pinch-off voltage of 2.2 volt.

The gate electrode 17 is formed on the channel region 12a, and the drain electrode 14 and the source electrode 16 of the first layer, both of which are made of ohmic metal layer 10, are formed on the n⁺-type high concentration regions 18, 19. The drain electrode 13 and the source electrode 15 of the third layer, both of which are made of the pad metal layer 30, are formed on the first layer electrodes 14, 16. The pad metal layer 30 also serves as wiring lines for connecting elements of FET.

FIG. 6B is a cross-sectional view of FET2. FET2 has a n-type channel region 12*b* with a low pinch-off voltage formed on a GaAs substrate 11. FET2 also has the source region 18 and the drain region 19, both of which are of a n+-type high impurity region and formed at respective ends of the channel region 12*b*.

Impurity ions ($^{29}$Si$^+$) are implanted into the area of the GaAs substrate for the channel layer formation with a total dose of $3.4 \times 10^{12}$ cm$^{-3}$ under the same acceleration voltage of 70 KeV. The formed channel region 12*b* is not etched when the gate electrodes are formed. FET2 formed under above conditions has shown the Idss of 0.04 ampere and a pinch-off voltage of 1.1 volt when the gate width is 400 μm.

Accordingly, the production process of this switching device has two separate ion implantation steps; one for FET1 and another for FET2. The two FETs are simultaneously processed in other steps of the production process. As long as proper Idss and proper pinch-off voltages are obtained for FET1 and FET2, other ion implantation conditions, including the total dosage and the acceleration voltage, may be applied to the ion implantation step.

Figure 7A:
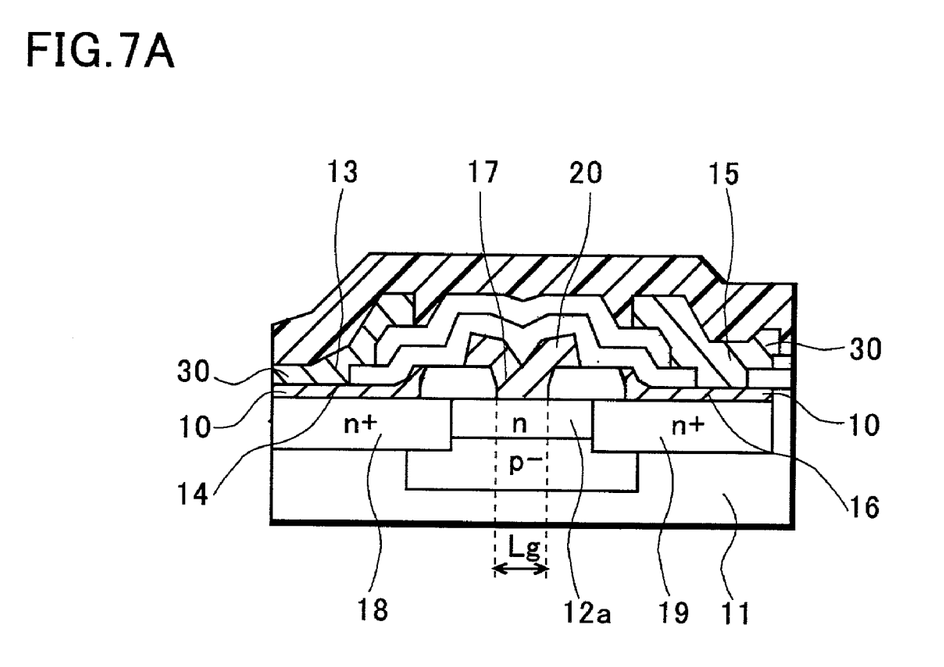
FIG. 7A is a cross-sectional view of FET1 for showing the depth of the channel layer.
Figure 7B:
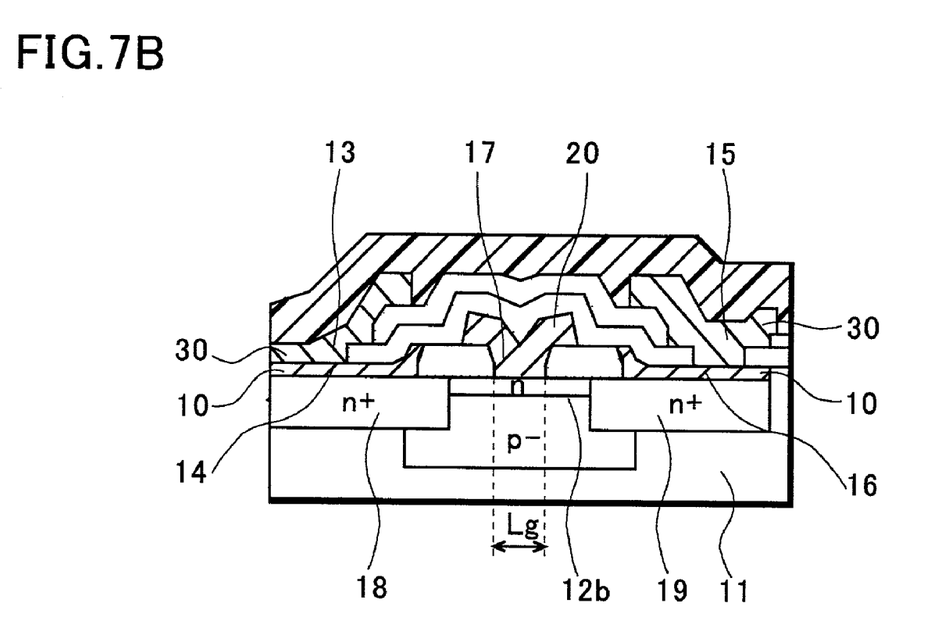
FIG. 7B is a cross-sectional view of FET2 for showing the depth of the channel layer.

Alternatively, substantially the same result is obtained by making the channel layer depth of FET1 larger than the channel layer depth of FET2, as shown in FIGS. 7A and 7B. The depth of the channel region 12*a* of FET1 of this modified embodiment is approximately 0.14 μm, and the depth of the channel region 12*b* of FET2 of this modified embodiment is approximately 0.11 μm. The channel region 12*a* of FET1 (on side) has a high Idss because of a large depth of the channel region 12*a*. The channel region 12*b* has a low pinch-off voltage because of a small depth of the channel region 12*b*. Except the construction of the channel layer, other constructions of the FET1 and FET 2 are substantially the same as the constructions of FET1 and FET2 of FIGS. 6A and 6B.

In this type of switching circuit, when the signal transmitting FET is transmitting signal, the signal receiving FET, which is turned off during signal transmitting, has to withstand the maximum power with which the signal transmitting FET is operating. Otherwise, signals being sent from the signal transmitting FET may leak through the signal receiving FET, making the maximum power allowed for the signal transmitting FET practically useless.

The maximum power allowed for the signal receiving FET ($P_{out2}$) in dBm is as follows:

$$P_{out2} = 10 \log_{10}[\text{Vmax}^2/(8R) \times 1000] \quad (2)$$

In equation (2), R is load resistance, which is 50Ω in this embodiment, and Vmax is a maximum voltage amplitude of applied power, which is related to the pinch-off voltage as described by the following equation:

$$\text{Vmax} = 4 \times (Vc - Vbi - Vp) \quad (3)$$

in which Vc is voltage of the control signal, Vbi is built-in voltage, and Vp is pinch-off voltage.

In this embodiment, a control signal of 3 V is applied to the control terminal Ctl-1 of the signal transmitting FET (FET1) when it is transmitting signals. Under the application of the control signal, a reverse bias of 2.6 V, which results from a subtraction of the built-in-voltage, 0.4 V, of the gate Schottky contact from the control signal, 3 V, is applied to the gate Schottky contact of FET2. The reverse bias creates a depletion layer in the channel region 12*b* of FET2. Because the signal receiving FET (FET2) has a pinch-off voltage of 1.1 V, the channel region 12*b* is pinched off under an application to the gate of a reverse bias equal to or higher than 1.1 V. In this case, a surplus of 1.5 V (2.6 V–1.1 V) is generated for pinching off the channel region 12*b* of FET2. In other words, a voltage equal to or less than this surplus can be applied to the switching device when it is transmitting signals without losing the signals through the off-state FET. This surplus, Su, is related to Vmax as follows:

$$Su = \text{Vmax}/4 \quad (4)$$

In this embodiment, since Vmax is equal to 1.5×4 V and R is equal to 50Ω, equation (2) gives an allowed maximum power of 19.5 dBm. Adding a surplus of about 3 dBm, which is experimentally shown to exist, to the calculated value, the signal receiving FET (FET2) has an allowed maximum power of about 22.5 dBm. An allowed maximum power for a switching device is determined by a smaller maximum power of the two maximum powers; i.e. the maximum power allowed for the signal transmitting FET determined by the Idss and the maximum power allowed for signal receiving FET determined by the pinch-off voltage. In this embodiment, the smaller maximum power of FET1 is 20.98 dBm and is still larger than the required power, 20 dBm, for applications such as BLUETOOTH and Wireless LAN.

Accordingly, the use of an asymmetrical circuit design, in which the signal transmitting FET has a larger Idss and the signal receiving FET has a smaller pinch-off voltage, allows the gate width to be reduced to about 400 μm, while maintaining an allowed maximum power similar to the maximum power of a symmetrical switching device. In this configuration, the Idss of the signal transmitting FET is preferably larger than the Idss of the signal receiving FET by 10% or more, and the pinch-off voltage of the signal transmitting FET is preferably larger than the pinch-off voltage of the signal receiving FET by 0.2 volt or more.

The operation of the switching device of this embodiment during the signal receiving mode is described hereinafter. As described with respect to the signal transmitting mode, the allowed maximum power of an on-side FET is determined by the Idss of the FET, and the allowed maximum power of an off-side FET is determined by the pinch-off voltage of the FET. Using equation (2) and a pinch-off voltage of 2.2 V, the signal transmitting FET (FET1), which is turned off in this mode, provides a maximum power of 8.1 dBm. Using equation (1) and the Idss of 0.04 ampere, the signal receiving FET (FET2), which is turned on in this mode, provides a maximum power of 13.7 dBm. Because the smaller of the two maximum powers determines the allowed maximum power of the switching device, the switching device of this embodiment has a allowed maximum power of 8.1 dBm in the signal receiving mode. This maximum power is enough since the maximum power required for receiving signals is only 0 dBm.

Figure 8A:
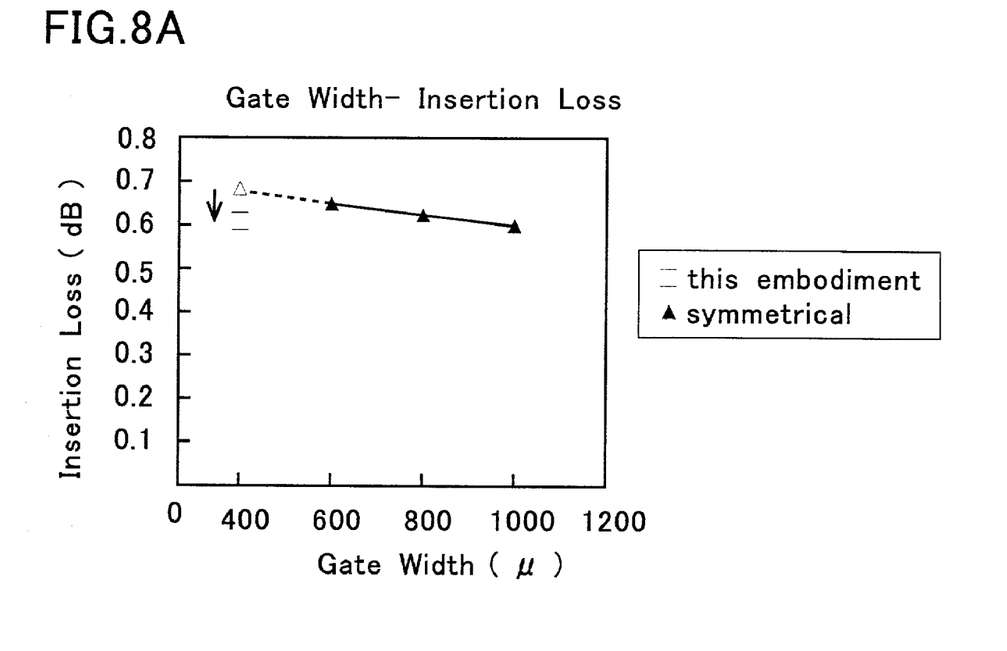
FIG. 8A shows the insertion loss of the switching device of the invention as a function of the gate width.

FIG. 8A shows the insertion loss of the switching device of this embodiment together with the insertion losses of symmetrical switching devices. All data were measured at an operating frequency of 2.4 GHz. The insertion loss of this embodiment is about 0.6 dB, which is lower than the simple extrapolation of the data measured on the symmetrical switching devices with gate widths from 600 to 1000 μm.

This discrepancy may be explained by taking the increased impurity concentration in the channel region into account. That is, the increased conductivity of the channel layer of the signal transmitting FET reduces its electric resistance. The resistance of FET1 of this embodiment is 8Ω, while the resistance of the symmetrical switching device of 600 μm gate width is 6.5Ω. If the same channel configuration (impurity concentration and channel depth) as the symmetrical switching device were to applied to this embodiment, the resistance would be as high as 9.75Ω.

Figure 8B:
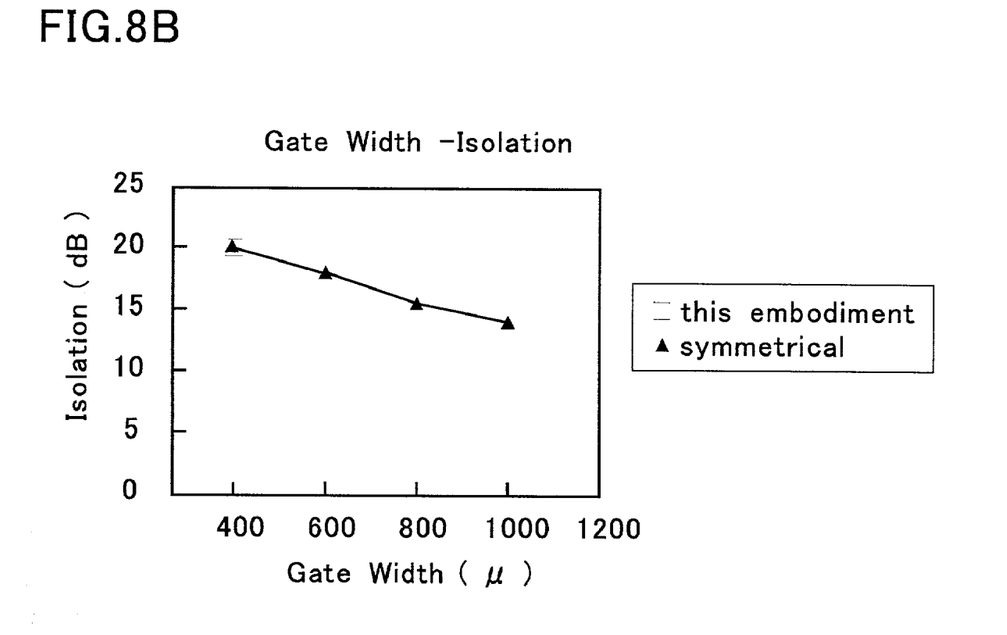
FIG. 8B shows the isolation of the switching device of the invention as a function of the gate width.

FIG. 8B shows the isolation of the switching device of this embodiment together with the isolations of the same symmetrical switching devices as shown in FIG. 8A. The isolation of this embodiment is about 20 dB, which is acceptable value with respect to the applications such as BLUETOOTH and Wireless LAN.

Other improvements have been made with respect to the circuit characteristics of the switching device of this embodiment. The first is that VSWR (Voltage Standing-Wave Ratio) of this embodiment is 1.1 to 1.2. VSWR is a measure of the reflection of the high frequency signals from a switching portion of a device. Specifically, VSWR is the ratio between the maximum and the minimum of a voltage standing wave which is generated by an incoming wave and a reflecting wave at a discontinuous portion of a transmission line of high frequency signal. In an ideal condition without any reflection, VSWR is equal to 1. The VSWR value of a switching device with shunts is about 1.4. The improvement of VSWR is possible because the switching device of this embodiment has only two switching FETs along the transmission line of the high frequency signal. The smaller size of the FETs also contributes to the reduction of the reflection.

Figure 9:
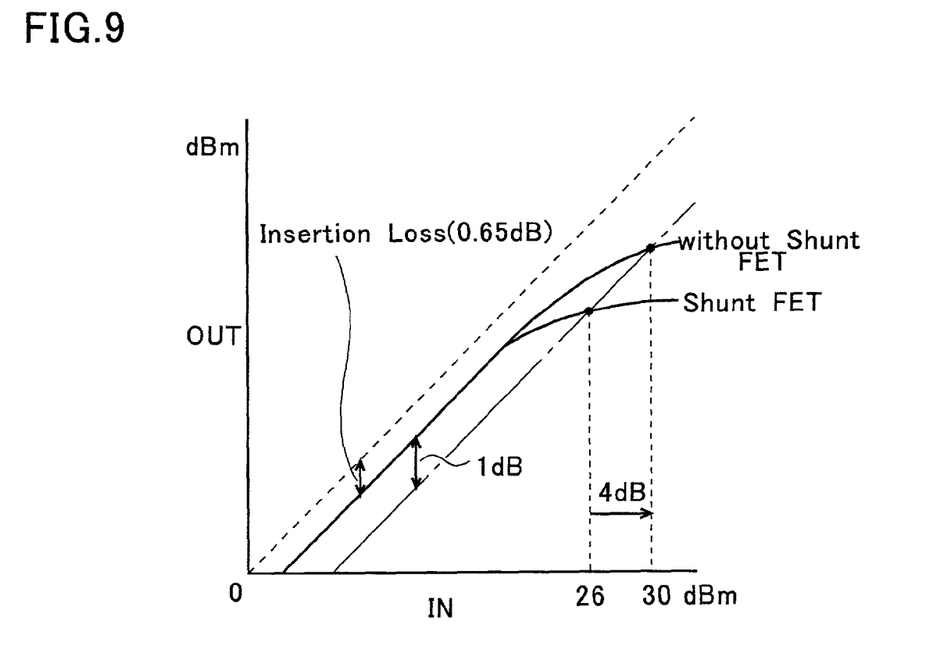
FIG. 9 shows a comparison between the dependency of output power on input power for the switching device of the embodiment of FIG. 3 and a prior art switching device with a shunt structure.

The second improvement is that the $P_{IN}1$ dB of signal transmitting FET of the device of this embodiment is 30 dBm. $P_{IN}1$ dB is a measure of the linearity between the input high frequency signal and the output signal, which is shown in FIG. 9. In the ideal case, the ratio between the input and output power is the insertion Loss (0.65 dB) in the linearity region. However, in actual cases, the output power decreases due to the limited maximum allowed power. Since the output power deviates from the linearity with the increase of the input power, $P_{IN}1$ dB is defined as the point where the output power is smaller than the input power by 1 dB plus the insertion loss in the linearity region. While the $P_{IN}1$ dB is 26 dBm for a switching device with shunt FETs, the value is 30 dBm for the switching device of this embodiment. Although the $P_{IN}1$ dB of the signal receiving FET is lower than 30 dBm, this does not create any problem because the power for transmitting signals is less than 0 dBm.

The advantage of the asymmetrical device design with 400 μm gate width is that its overall chip size is smaller than switching devices of symmetrical design, the minimum gate widths of which are about 600 μm, while assuring proper insertion loss (0.6 dB) and isolation (20 dB) without the use of shunts FETs at frequencies of 2.4 GHz or higher. This is a 13% reduction of overall chip size with respect to the symmetrical switching device with 600 μm gate width.

The above is a detailed description of a particular embodiment of the invention which is not intended to limit the invention to the embodiment described. It is recognized that modifications within the scope of the invention will occur to a person skilled in the art. Such modifications and equivalents of the invention are intended for inclusion within the scope of this invention.

What is claimed is:

1. A semiconductor switching device comprising:
   a first field effect transistor and a second field effect transistor, each comprising a source electrode, a gate electrode and a drain electrode which are formed on a channel layer of the respective transistor, each of the first transistor and the second transistor having a gate width equal to or less than 400 μm, the first transistor and the second transistor having different saturation currents;
   a common input terminal connected to the source electrode or the drain electrode of the first transistor and connected to the source electrode or the drain electrode of the second transistor;
   a first output terminal connected to the source electrode or the drain electrode of the first transistor which is not connected to the common input terminal; and
   a second output terminal connected to the source electrode or the drain electrode of the second transistor which is not connected to the common input terminal,
   wherein gates of the first transistor and the second transistor receive control signals so that when one of the transistors opens as a switching element, the other of the transistors closes as another switching element,
   the transistor with the higher saturation current has a higher pinch-off voltage than the transistor with the lower saturation current, and
   a difference between a reverse bias voltage applied to the transistor with the lower saturation current and a pinch-off voltage of the transistor with the lower saturation current is such that the transistor with the lower saturation current withstands a predetermined maximum power when the transistor with the higher saturation current allows the predetermined power to pass therethrough.

2. The semiconductor switching device of claim 1, wherein the channel layers of the first transistor and the second transistor have different impurity concentrations.

3. The semiconductor switching device of claim 1, wherein the channel layers of the first transistor and the second transistor have different depths.

4. The semiconductor switching device of claim 1, further comprising a semi-insulating GaAs substrate on which the channel layers are formed.

5. The semiconductor switching device of claim 1, wherein the gate electrodes of the first transistor and the second transistor form Schottky contacts with the channel layer and the source and drain electrodes of the first transistor and the second transistor form ohmic contacts with the channel layer.

6. The semiconductor switching device of claim 1, wherein the saturation current of the first transistor is larger than the saturation current of the second transistor by 10% or more.

7. The semiconductor switching device of claim 1, wherein a pinch-off voltage of the first transistor is larger than a pinch-off voltage of the second transistor by 0.2 volt or more.

8. The semiconductor switching device of claim 1, wherein the pinch-off voltage of the transistor with the higher saturation current is larger than the pinch-off voltage of the transistor with the lower saturation current by 0.2 volt or more.

9. The semiconductor switching device of claim 1, wherein the gate width of the first transistor is equal to the gate width of the second transistor.

* * * * *